(12) United States Patent
Lin et al.

(10) Patent No.: US 7,719,330 B2
(45) Date of Patent: May 18, 2010

(54) PHASE LOCKED LOOP DEVICE AND CONTROL METHOD THEREOF

(75) Inventors: Kuo-Kai Lin, Taipei (TW); Hou-Kuan Sung, Taipei (TW)

(73) Assignee: Ali Corporation, Taipei (TW)

( * ) Notice: Subject to any disclaimer, the term of this patent is extended or adjusted under 35 U.S.C. 154(b) by 81 days.

(21) Appl. No.: 11/964,094

(22) Filed: Dec. 26, 2007

(65) Prior Publication Data
US 2009/0167385 A1 Jul. 2, 2009

(51) Int. Cl.
*H03L 7/06* (2006.01)
(52) U.S. Cl. .................................. 327/157; 327/148
(58) Field of Classification Search ............... 327/147, 327/148, 150, 156, 157, 159, 162, 163
See application file for complete search history.

(56) References Cited

U.S. PATENT DOCUMENTS

| | | | | |
|---|---|---|---|---|
| 5,382,922 A | * | 1/1995 | Gersbach et al. ............ | 331/1 A |
| 6,002,302 A | * | 12/1999 | Pang ......................... | 331/1 A |
| 6,330,296 B1 | * | 12/2001 | Atallah et al. ............... | 375/376 |
| 6,753,711 B2 | * | 6/2004 | McCollum et al. .......... | 327/156 |
| 6,952,124 B2 | * | 10/2005 | Pham ......................... | 327/156 |
| 7,263,152 B2 | * | 8/2007 | Miller et al. ................ | 375/371 |
| 7,310,009 B2 | * | 12/2007 | Oh ............................. | 327/156 |
| 7,388,440 B1 | * | 6/2008 | Giust et al. .................. | 331/17 |

* cited by examiner

*Primary Examiner*—Hai L Nguyen
(74) *Attorney, Agent, or Firm*—Thomas, Kayden, Horstemeyer & Risley

(57) ABSTRACT

A phase locked loop device is provided. The phase locked loop device includes a phase/frequency detector, a charge pump, a low pass filter, a voltage-controlled oscillator, and a control unit. The phase/frequency detector generates a compared signal corresponding to a phase difference between a reference clock signal and a feedback clock signal. The charge pump coupled to the phase/frequency detector generates a pump current according to the compared signal. The low pass filter coupled to the charge pump generates an operating voltage corresponding to the pump current. The voltage-controlled oscillator coupled to the low pass filter generates an output clock signal in response to the operating voltage. The control unit coupled to the low pass filter and the voltage-controlled oscillator constrains the operating voltage to a predetermined voltage level when the frequency of the output clock signal is out of a predetermined frequency range.

10 Claims, 5 Drawing Sheets

| $S_1$ | $F_o$ | CLK | $S_2$ | Switch 220 |
|---|---|---|---|---|
| HIGH | $F_o < FVCO_{LOW}$ | $F_o = CLK < FVCO_{LOW}$ | LOW | OFF |
| HIGH | $F_o > FVCO_{LOW}$ | $F_o = CLK > FVCO_{LOW}$ | HIGH | ON |
| LOW | $F_o < FVCO_{LOW}$ | $0 = CLK < FVCO_{LOW}$ | LOW | OFF |
| LOW | $F_o > FVCO_{LOW}$ | $0 = CLK > FVCO_{LOW}$ | LOW | OFF |

FIG. 4

PHASE LOCKED LOOP DEVICE AND CONTROL METHOD THEREOF

BACKGROUND OF THE INVENTION

1. Field of the Invention

The invention relates generally to a frequency modulating circuit, and more particularly to a device and method for automatically modulating a phase locked loop.

2. Description of the Related Art

A phase locked loop (PLL) is a circuit able to synchronize an output signal generated by an oscillator with a reference or input signal in frequency and phase.

A voltage-controlled oscillator in a phase locked loop used to let voltage as the frequency control variable. In addition to voltage, current or another electronic variable parameter may be applied. Generally, when the output frequency of a voltage-controlled oscillator (VCO) is out of a predetermined range, then the phase locked loop may not lock the desired frequency. The predetermined range corresponds to an oscillation frequency in relation to a control voltage characteristic of the voltage-controlled oscillator. If an oscillation frequency of the voltage-controlled oscillator is over a stated maximum value of the predetermined range, or below the minimum value of the predetermined range, it may result in a problem where the output signal frequency of the phase locked loop is incapable of corresponding to an input signal of the phase locked loop. During this condition, the phase locked loop becomes unable to lock. Though the output signal of the phase locked loop may oscillate to drive the loop back to "locked", the oscillations are still so high or low in frequency, they are unable to prevent the phase locked loop from not performing its intended functions. Therefore, it is desirable to provide a device and method that is capable of "locking" the phase locked loop when the loop is unable to achieve frequency locking.

One process to achieve improved performance is disclosed in U.S. Pat. No. 6,956,416. The patent application discloses the reduction of the chances that the phase locked loop produces unintended operating states. A control circuit periodically determines whether the phase lock is properly operating according to an output signal of the phase locked loop and a control voltage of the voltage-controlled oscillator. When the phase locked loop reaches a locked condition, the control circuit asserts a STABLE signal to indicate the output signal may be used. Otherwise, if the phase locked loop cannot reach the locked condition, the control circuit subsequently reset the phase locked loop according to an ENABLE signal. After being reset, the phase locked loop may restart and then reach the locked state. From the above-mentioned, however, no clamping method for recovering the phase locked loop from an incapable of lock state, back to a capable of lock state is presented.

Consequently, there is a need for a more reliable and improved phase locked loop device with reduced cost. Further, it would be desirable to provide a phase locked loop device and control method that is capable of detecting and ensuring that the phase locked loop is maintained.

BRIEF SUMMARY OF THE INVENTION

Accordingly, the invention provides an improved phase locked loop device with self-adjustment without the need for external control. According to an embodiment of the invention, a phase locked loop device is provided. The phase locked loop device comprises a phase/frequency detector to generate a compared signal; a charge pump coupled to the phase/frequency detector to generate a pump current according to the compared signal; and a low pass filter coupled to the charge pump generates an operating voltage corresponding to the pump current. A voltage-controlled oscillator included in the phase locked loop device is responsive to the operating voltage for generating an output clock signal. Further, a control unit is coupled to the low pass filter and the voltage-controlled oscillator for constraining the operating voltage to a predetermined voltage level when the frequency of the output clock signal is out of a predetermined frequency range. The control unit further comprises a voltage comparator, a clock detector and a voltage converter. The voltage comparator provides a first output signal corresponding to the voltage level difference between the operating voltage and an inner-reference voltage. The clock detector coupled to the voltage comparator and the output clock generates a second output signal in response to the first output signal and the output clock signal. The voltage converter coupled to the clock detector constrains the operating voltage to the predetermined voltage level corresponding to the second output signal. When the operating voltage is constrained to the predetermined voltage level, the phase locked loop device is able to achieve frequency locking.

According to another embodiment of the invention, a control method is provided for modulating an oscillation frequency out of a predetermined frequency range. A compared signal corresponsive to a phase difference between a reference clock signal and a feedback clock signal is provided by a phase/frequency detector. According to the compared signal, an operating voltage is generated from a low pass filter. Further, an output clock signal corresponding to the operating voltage is output from a voltage-controlled oscillator coupled thereto. Thereby, the control unit determines whether the frequency of the output clock signal is within the frequency range. Following determination by the control unit, the operating voltage is then constrained to a predetermined voltage level when the frequency of the output clock signal is out of the predetermined frequency range. Moreover, the step of constraining the operating voltage further comprises providing a first output signal by comparing the operating voltage and an inner-reference voltage via a voltage comparator. A second output signal is then generated by a clock detector in response to the first output signal and the output clock signal. Therefore, the operating voltage is calibrated to the predetermined voltage level by a voltage converter coupled to the clock detector to correspond with the second output signal. Consequently, the phase locked loop device is able to maintain the output clock signal within the predetermined frequency range.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 4 is a table illustrating the operation of the clock detector employed by a preferred embodiment in accordance with the invention.

DETAILED DESCRIPTION OF THE INVENTION

Figure 1:
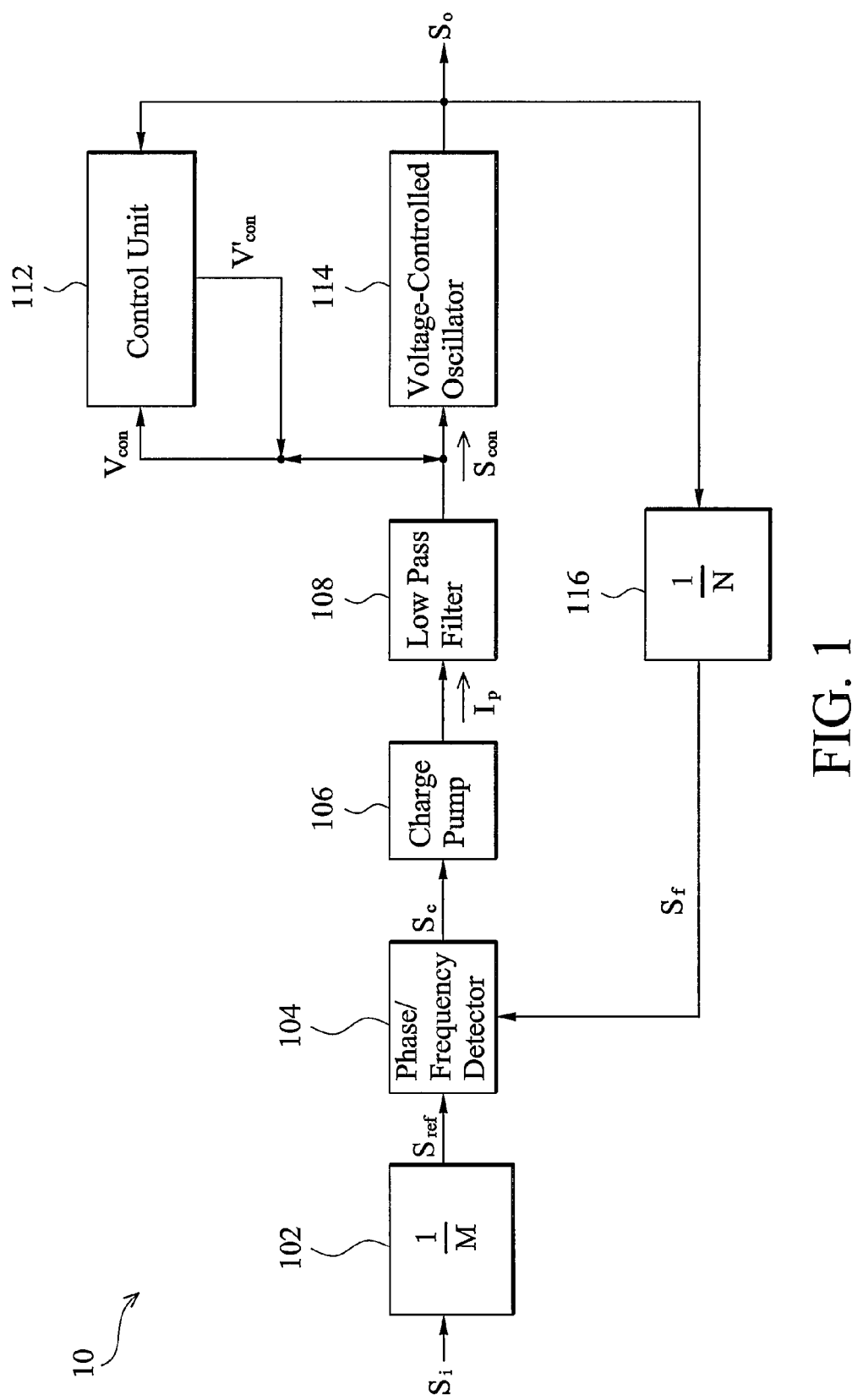
FIG. 1 is a block diagram for illustrating a phase locked loop device in accordance with the invention.

The following exemplary embodiments of the invention are described with reference to FIGS. 1 through 5, which relate to a phase locked loop device and control method thereof. It is to be understood that the following disclosure provides various different embodiments as examples for implementing different features of the invention. Specific examples of components and arrangements are described in the following to simplify the present disclosure. These are merely examples and are not intended to be limiting. In addition, the present disclosure may repeat reference numerals and/or letters in the various examples. This repetition is for the purpose of simplicity and clarity and does not in itself dictate a relationship between the various described embodiments and/or configurations.

The invention relates to a phase locked loop device, which clamps the oscillation frequency, as well as a control method for maintaining the locked oscillation frequency.

FIG. 1 is a block diagram for illustrating a phase locked loop device 10 in accordance with the invention having a phase/frequency detector 104, a charge pump 106, a low pass filter 108, a voltage-controlled oscillator 114, and a control unit 112.

The phase/frequency detector 104 generates a compared signal $S_c$ corresponding to a phase difference between a reference clock signal $S_{ref}$, and a feedback clock signal $S_f$, wherein the reference clock signal $S_{ref}$, obtained from an input frequency divider 102, makes by dividing the frequency of an input clock signal $S_i$ by a parameter M. The charge pump 106 corrects the compared signal $S_c$ from the phase/frequency detector 104, so as to generate a pump current $I_p$. The low pass filter 108 smoothes the pump current $I_p$ and then outputs an operating voltage $V_{con}$, that is, the voltage of an operating signal $S_{con}$, to the voltage-controlled oscillator 114.

Additionally, according to the operating signal $S_{con}$, the voltage-controlled oscillator 114 subsequently generates an output clock signal $S_o$. The frequency of the output clock signal $S_o$ varies according to a control voltage characteristic of the voltage-controlled oscillator 114.

In one embodiment, the phase locked loop achieves locking when the frequency or phase difference between the output clock signal $S_o$ and the input clock signal $S_i$ is substantially equal or within a desired range. Otherwise, to eliminate the phase difference between the output clock signal $S_o$ and the input clock signal $S_i$, the output clock signal $S_o$ is fed back to the phase/frequency detector 104 as the feedback clock signal $S_f$ through a feedback frequency divider 116. Generally, the feedback frequency divider 116 with a parameter N characterizes the frequency of the output clock signal $S_o$ formula, as a multiple of that of the input clock signal $S_i$.

Further, the phase locked loop device 10 comprises the control unit 112 coupled to the low pass filter 108 and the voltage-controlled oscillator 114. During operation, when the voltage or the oscillation frequency from the voltage-controlled oscillator 114 is not within a predetermined value, a problem occurs where the frequency of the output clock signal $S_o$ may fail to correspond to that of the input clock signal $S_i$, that is, the phase locked loop is unable to lock. When the phase locked loop is unable to achieve a locked state, the control unit 112 constrains the voltage of an operating signal $S_{con}$ to a predetermined voltage level.

Figure 2:
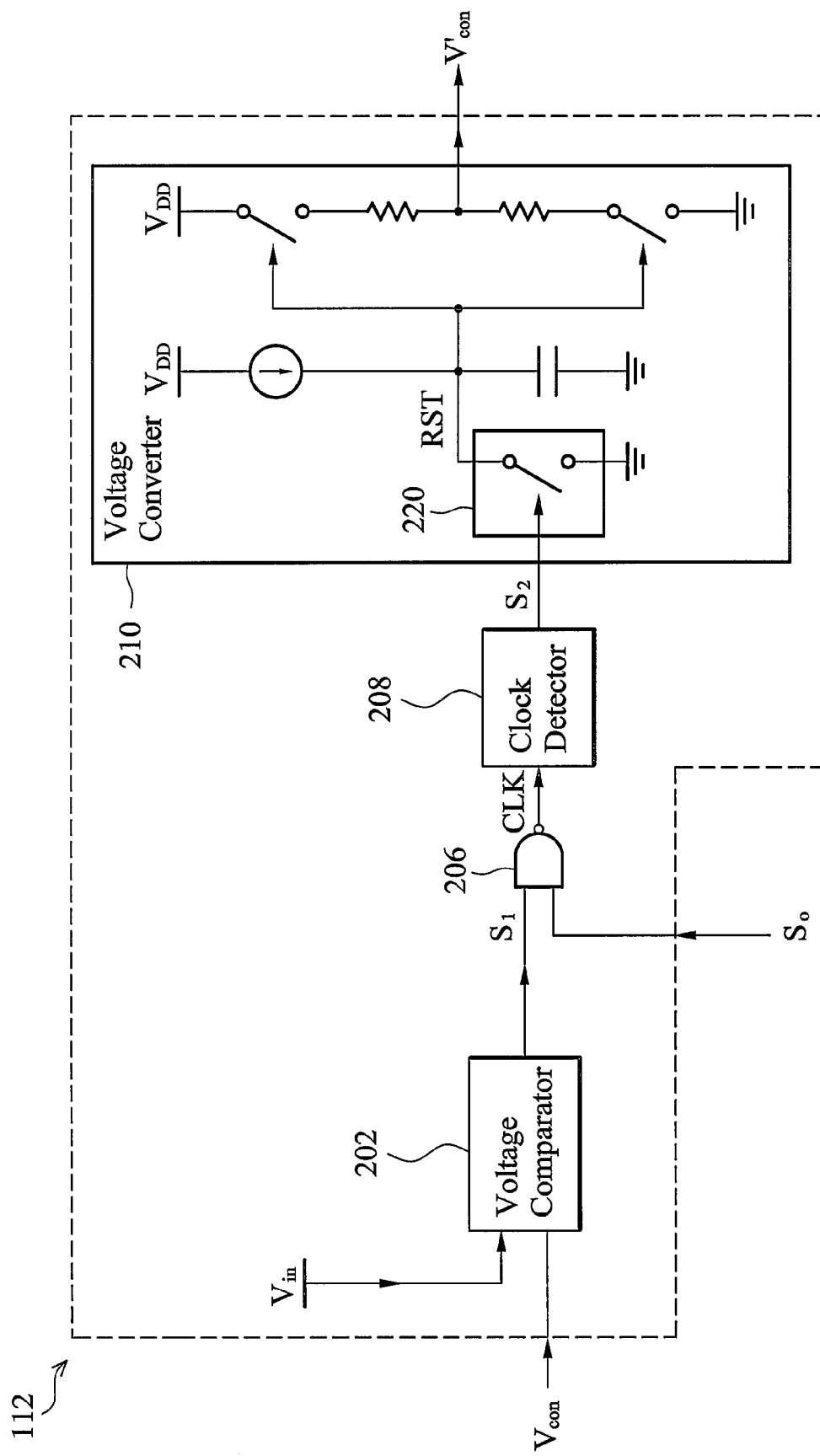
FIG. 2 is a detailed diagram illustrating an embodiment of the control unit shown in FIG. 1.

Referring to FIG. 2, which is a detailed diagram illustrating an embodiment of the control unit 112 shown in FIG. 1. As shown in FIG. 2, the control unit 112 comprises a voltage comparator 202, a clock detector 208, and a voltage converter 210. The voltage comparator 202 generates a first output signal $S_1$ in accordance with the voltage level difference between the operating voltage $V_{con}$ and an inner-reference voltage $V_{in}$. The clock detector 208 then provides a second output signal $S_2$, in response to the first output signal $S_1$ and the output clock signal $S_o$. With the second output signal $S_2$, the voltage comparator 202 coupled to the clock detector 208 constrains the operating voltage $V_{con}$ to the predetermined voltage level corresponding to the second output signal $S_2$.

Figure 3:
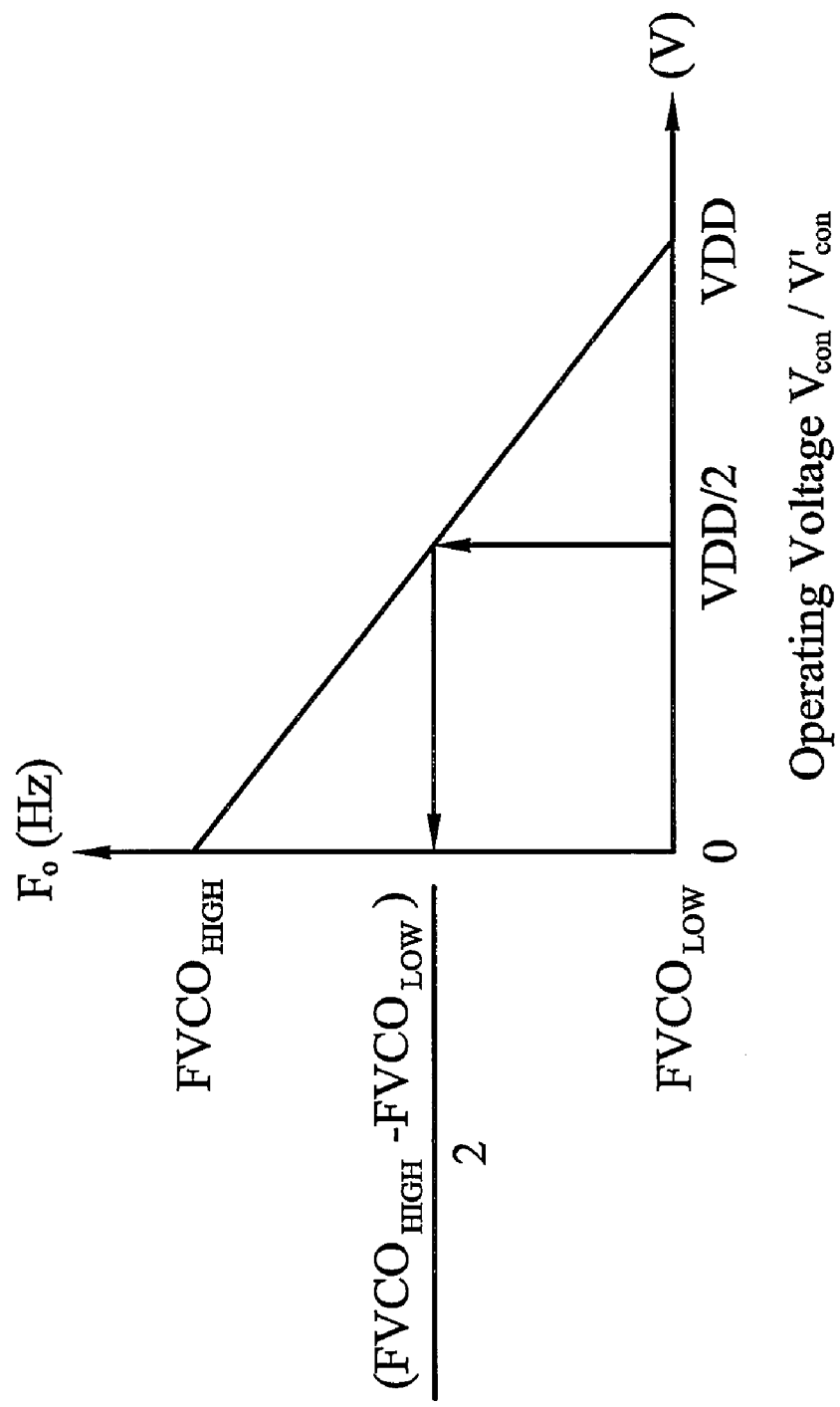
FIG. 3 is a graph illustrating an example of transfer characteristic of the output frequency in relation to the input voltage of the voltage-controlled oscillator employed by the phase locked loop device shown in FIG. 1.

Moreover, referring to FIG. 3, FIG. 3 is a graph illustrating an example of transfer characteristics of the output frequency in relation to the input voltage of the voltage-controlled oscillator employed by the phase locked loop device 10 shown in FIG. 1. Further, from the aforementioned, the predetermined frequency range is determined by selecting one of the transfer characteristics of the voltage-controlled oscillator 114. Referring to FIGS. 1 and 2, the control unit 112 is tuned and the voltage-controlled oscillator 114 locks to an oscillation frequency. The operation of the control unit 112 is further detailed in the following.

When the oscillation frequency of the voltage-controlled oscillator 114 is too high or too low, the loop disengages from the locked state and becomes an "open loop".

In one embodiment, when the initial current is too low or zero, thereby causing the voltage-controlled oscillator 114 to not oscillate in the required frequency, the frequency $F_o$ of the output clock signal $S_o$ becomes relatively low $FVCO_{LOW}$ or zero, as shown in FIG. 3. Referring now to FIG. 4, which is a look-up table illustrating the operation of the clock detector 208 employed by a preferred embodiment in accordance with the invention. As shown in FIG. 4, the CLK indicates the result from a NAND gate 206, performing an operation of the NAND gate 206 on the output clock signal $S_o$ and the first output signal $S_1$. In this embodiment, irrespective of the input of the operating voltage $V_{con}$, the NAND gate 206 outputs a low frequency clock or logic high level (HIGH) in response to the output clock signal $S_o$ with low or zero frequency $F_o$. Then the clock detector 208 generates the second output signal $S_2$ with a logic low level (LOW). Following, a signal is generated at a node RST by a switch 220 coupled to the clock detector 208 turning on or turning off, as shown in FIG. 2. In this embodiment, the second output signal $S_2$ with a logic low level (LOW) turns off the switch 220 (OFF in FIG. 4). Then, at the node RST, a signal with logic high level (HIGH) of the voltage VDD constrains the operating voltage $V_{con}$ of a fixed voltage VDD/2, denoted as a calibrated operating voltage $V'_{con}$. Referring to FIG. 3, the voltage-controlled oscillator 114 accordingly supplies the frequency $F_o$ of the output clock signal $S_o$ is $(FVCO_{HIGH}-FVCO_{LOW})/2$.

Next, the operating voltage $V'_{con}$, and the output clock signal $S_o$ with frequency $F_o$ calibrated above are fed back to the control unit 112. As shown in FIG. 2, the voltage comparator 202 compares an inner-reference voltage $V_{in}$, such as a zero voltage, with the operating voltage $V'_{con}$, equaling to VDD/2, and then outputs the first output signal $S_1$ with the logic high level (HIGH) of the voltage VDD. The other input of the NAND gate 206 is a predetermined frequency clock due to the calibrated frequency $F_o$ of the output clock signal $S_o$. According to the operation table shown in FIG. 4, the clock detector 208 generates the second output signal $S_2$ with the high voltage level (HIGH) for turning on the switch 220

(ON in FIG. 4) coupled thereto. As a result, node RST is pulled down to zero voltage, allowing the operating voltage $V'_{con}$ to freely run. As desired, the loop is able to reach a locked state caused by a significantly low oscillation frequency.

Similarly, in another embodiment, when the oscillation frequency $F_o$ of the output clock signal $S_O$ has reached too high a value, the charge pump 106 discharges the pump current $I_p$ flowing into the low pass filter 108. Accordingly, the operating voltage $V_{con}$ is made equal to a low voltage level, approximate zero voltage. Referring to FIG. 2, assuming the inner-reference voltage $V_{in}$ is operating at a low voltage level and the voltage comparator 202 establishes the first output signal $S_1$ with the logic low level (LOW). As described above, the clock detector 208 subsequently generates the second output signal $S_2$ with a logic low level (LOW) for disabling the switch 220 (OFF in FIG. 4) of the voltage converter 210. Furthermore, the operating voltage $V'_{con}$ is fixed at the voltage VDD/2. Utilizing the calibrated operating voltage $V'_{con}$, as shown in FIG. 3, the frequency $F_o$ of the output clock signal $S_o$ is $(FVCO_{HIGH}-FVCO_{LOW})/2$ is obtained. Like the above, the operating voltage $V'_{con}$ and the output clock signal $S_o$ with calibrated frequency $F_o$ are then fed back to the control unit 112 to controls voltage so as to freely run. Consequently, the oscillation frequency $F_o$ from the voltage-controlled oscillator 114 is constrained and the loop then recovers from an unstable state to a locked state.

Note that the transfer characteristics for the voltage-controlled oscillator 114 may be varied as desired; for example, the slope of the curve shown in FIG. 3 may be differed to scale the operating voltage $V_{con}$ and obtain the corresponding frequency. Moreover, the predetermined frequency range is varied in accordance with different slopes of the curves.

Figure 5:
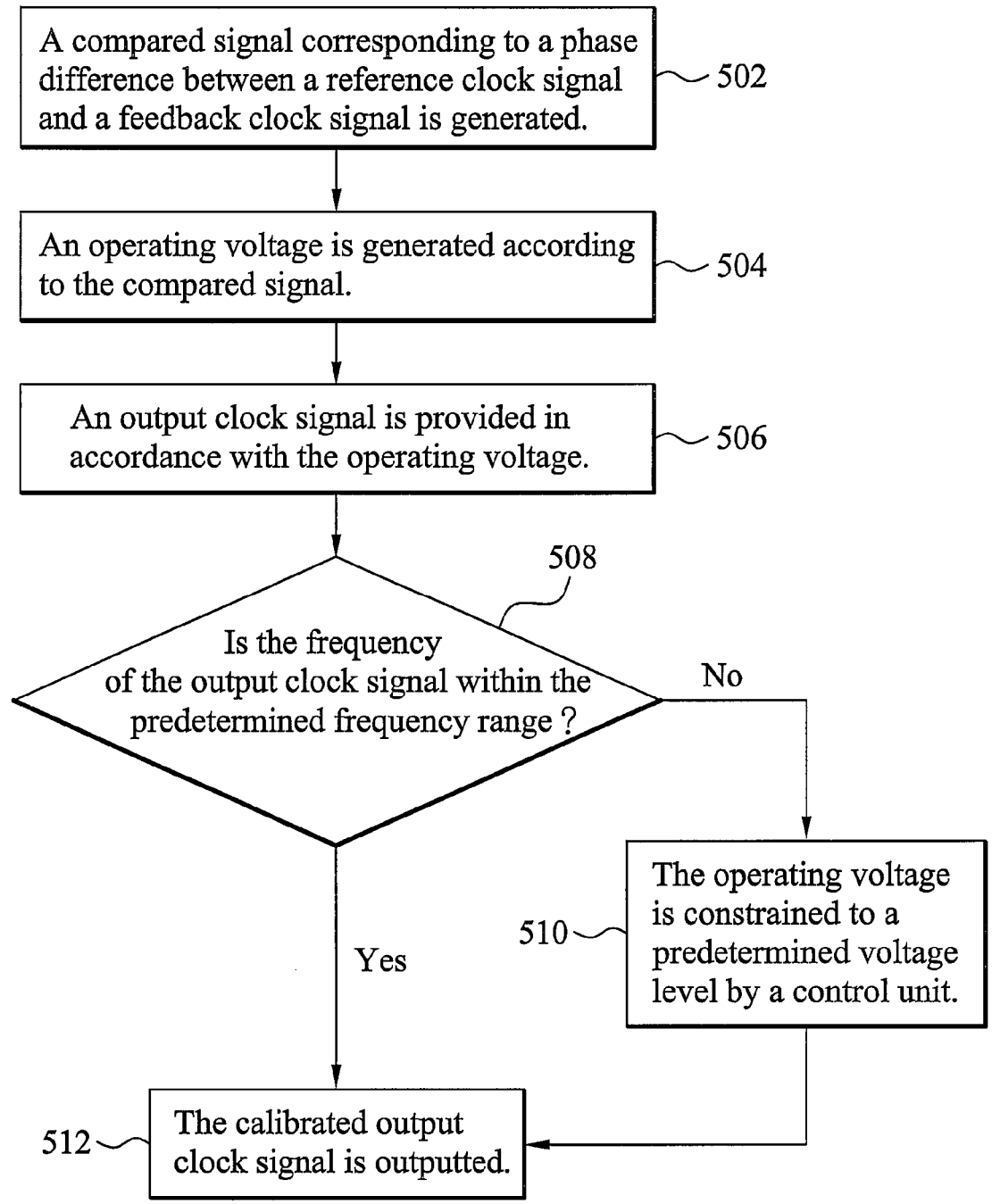
FIG. 5 is a flowchart of an embodiment of a control method for a phase locked loop device according to the invention.

FIG. 5 is a flowchart of an embodiment of a control method for a phase locked loop device according to the invention, first, a compared signal (or phase comparison), is conducted between a reference clock signal and a feedback clock signal from a phase/frequency detector (step 502). Generally, the reference clock signal is obtained from dividing an input clock signal by a parameter M applied in an input frequency divider.

After the compared signal is generated, a charge pump coupled to the phase/frequency detector outputs a pump current and then a low pass filter coupled to the charge pump generates an operating voltage corresponding to the pump current (step 504). Further, the operating voltage is outputted from a low pass filter in accordance with a pump current, which is generated by a charge pump according to the compared signal.

When a voltage-controlled oscillator has received the operating voltage, it generates an output clock signal (step 506). Moreover, the output clock signal is fed back to the phase/frequency detector through a feedback frequency divider. The output clock signal is divided by parameter N to obtain the feedback clock signal.

After the output clock signal is generated, it is determined whether the frequency of the output clock signal is within a predetermined frequency range (step 508). In general, the predetermined frequency range is defined by one of the different transfer characteristics performed by the voltage-controlled oscillator. With one selected transfer characteristic of the voltage-controlled oscillator, that is, with the predetermined frequency range, the voltage-controlled oscillator controls the oscillation frequency by means of the operating voltage.

Continuing with the operation of the control method shown in FIG. 5, when the frequency of the output clock signal is in the predetermined frequency range, the loop operates to lock the output clock signal with the input clock signal and then reaches a locked condition. In this condition, the phase locked loop device may output the output clock signal (step 512).

Alternatively, when the frequency of the output clock signal is not within the predetermined frequency range, the phased locked loop may be incapable of being locked. Once the loop may be incapable of reaching a locked condition, a control unit routine described in detail below is used to constrain the operating voltage to a predetermined voltage level (step 510). The routine begins by $F_o$ and comparing the operating voltage and an inner-reference voltage, and generating a first output signal. Next, a second output signal is generated by a clock detector according to the first output signal from a voltage comparator and the output clock signal. With the second output signal, the operating voltage is accordingly calibrated to a fixed voltage by a voltage converter coupled to the clock detector. As a result, the frequency of the output clock signal from the voltage-controlled oscillator is constrained within the predetermined frequency range, and the loop is correspondingly operated to provide a new phase lock. Finally, the calibrated output clock signal is maintained within the predetermined range and outputted from the phase locked loop device (step 512).

While the invention has been described by way of example and in terms of preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase locked loop device comprising:
   a phase/frequency detector generating a compared signal corresponding to a phase difference between a reference clock signal and a feedback clock signal;
   a charge pump, generating a pump current according to the compared signal;
   a low pass filter coupled to the charge pump to generate an operating voltage corresponding to the pump current;
   a voltage-controlled oscillator coupled to the low pass filter to generate an output clock signal in response to the operating voltage; and
   a control unit coupled to the low pass filter and the voltage-controlled oscillator, wherein when the frequency of the output clock signal is out of a predetermined frequency range, the control unit constrains the operating voltage to a predetermined voltage level, and the control unit comprising:
      a voltage comparator providing a first output signal corresponding to the voltage level difference between the operating voltage and an inner-reference voltage;
      a clock detector, coupled to the voltage comparator and the output clock, generating a second output signal in response to the first output signal and the output clock signal; and
      a voltage converter coupled to the clock detector to constrain the operating voltage to the predetermined voltage level corresponding to the second output signal.

2. The phase locked loop device of claim 1, further comprising a feedback frequency divider to divide the frequency of the output clock signal and to generate the feedback clock signal according to a parameter N, wherein the frequency of the feedback clock signal is N times the frequency of the output clock signal.

3. The phase locked loop device of claim 1, further comprising an input frequency divider to divide the frequency of an input clock signal and to generate the reference clock signal according to a parameter M, wherein the frequency of the reference clock signal is M times the frequency of the input clock signal.

4. The phase locked loop device of claim 1, wherein the voltage-controlled oscillator is operable with different transfer characteristics of the operating voltage in relation to the frequency of the output clock signal.

5. The phase locked loop device of claim 4, wherein the predetermined frequency range is determined by selecting one of the different transfer characteristics.

6. A control method for a phase locked loop device maintaining an output clock signal within a predetermined frequency range, the control method comprising:
 providing a phase/frequency detector to generate a compared signal corresponding to a phase difference between a reference clock signal and a feedback clock signal;
 generating a pump current from a charge pump according to the compared signal;
 generating an operating voltage corresponding to the pump current from a low pass filter coupled to the charge pump;
 supplying a voltage-controlled oscillator coupled to the low pass filter to generate the output clock signal corresponding to the operating voltage;
 providing a control unit to determine whether the frequency of the output clock signal is within the predetermined frequency range; and
 constraining the operating voltage to a predetermined voltage level when the frequency of the output clock signal is out of the predetermined frequency range,
 wherein the step of constraining the operating voltage further comprises:
  providing a first output signal by comparing the operating voltage and an inner-reference voltage via a voltage comparator;
  generating a second output signal from a clock detector in response to the first output signal and the output clock signal; and
  providing a voltage converter coupled to the clock detector to calibrate the operating voltage corresponding to the second output signal.

7. The control method of claim 6, further comprising the step of:
 receiving the output clock signal and dividing the output clock signal by a parameter N to obtain the feedback clock signal to the phase/frequency detector.

8. The control method of claim 6, further comprising the step of:
 receiving an input clock signal and dividing the input clock signal by a parameter M to obtain the reference clock signal to the phase/frequency detector.

9. The control method of claim 6, wherein the voltage-controlled oscillator is operable with different transfer characteristics of the operating voltage in relation to the frequency of the output clock signal.

10. The control method of claim 9, wherein the predetermined frequency range is determined according to one of the different transfer characteristics.

* * * * *